(12) United States Patent
Wang et al.

(10) Patent No.: US 10,615,317 B2
(45) Date of Patent: Apr. 7, 2020

(54) MATERIAL FOR AN ELECTRONIC DEVICE

(71) Applicant: City University of Hong Kong, Kowloon (HK)

(72) Inventors: Aiwu Wang, Kowloon (HK); Yang Yang Li, Kowloon (HK); Jian Lu, Kowloon (HK)

(73) Assignee: CITY UNIVERSITY OF HONG KONG, Kowloon (HK)

( * ) Notice: Subject to any disclaimer, the term of this patent is extended or adjusted under 35 U.S.C. 154(b) by 0 days.

(21) Appl. No.: 16/015,241

(22) Filed: Jun. 22, 2018

(65) Prior Publication Data

US 2018/0301601 A1    Oct. 18, 2018

Related U.S. Application Data

(62) Division of application No. 15/188,181, filed on Jun. 21, 2016, now Pat. No. 10,032,966.

(51) Int. Cl.
*H01L 33/50* (2010.01)
*C09K 11/02* (2006.01)
*C09K 11/65* (2006.01)

(52) U.S. Cl.
CPC ............ *H01L 33/502* (2013.01); *C09K 11/02* (2013.01); *C09K 11/65* (2013.01); *H01L 33/505* (2013.01); *H01L 2933/0041* (2013.01)

(58) Field of Classification Search
CPC ..... H01L 33/50; H01L 33/502; H01L 33/505; C09K 11/02; C09K 11/65
USPC .......................................... 257/98
See application file for complete search history.

(56) References Cited

U.S. PATENT DOCUMENTS

| | | | | |
|---|---|---|---|---|
| 7,115,349 B2* | 10/2006 | Iida | .......................... | G03G 9/08 430/108.24 |
| 2017/0152419 A1* | 6/2017 | Rantala | ................ | C08K 5/0025 |

* cited by examiner

*Primary Examiner* — Monica D Harrison

(74) *Attorney, Agent, or Firm* — Renner Kenner Greive Bobak Taylor & Weber

(57) ABSTRACT

A material for an electronic device includes a substance arranged to emit light in a predetermined range of wavelength upon receiving an excitation energy, wherein the substance includes a plurality of carbon nitride particles and a siloxane material. A method of producing the material and a light emitting device including the material are also described.

21 Claims, 18 Drawing Sheets

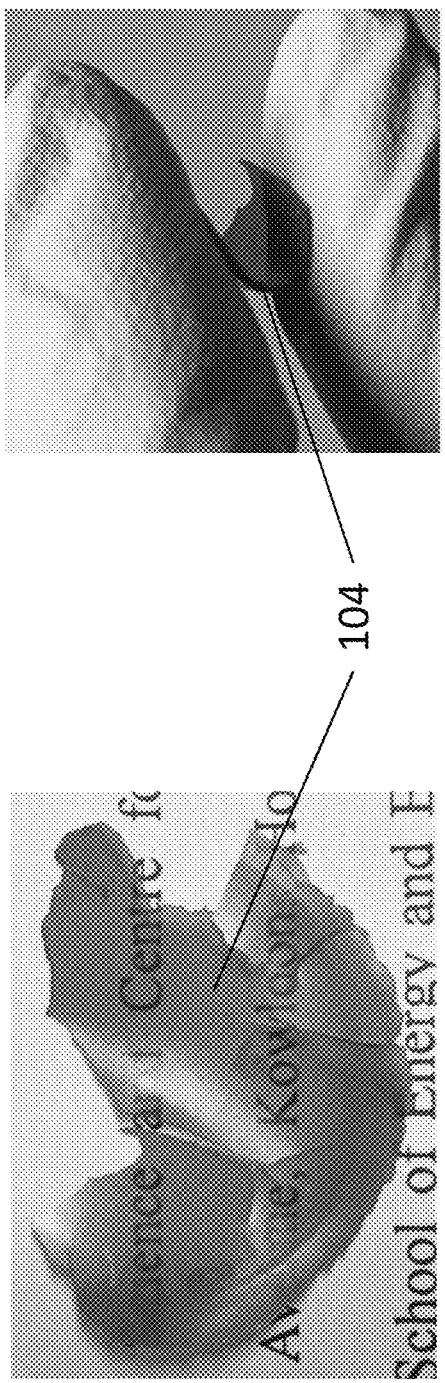
FIG. 11
FIG. 12
FIG. 13
FIG. 14

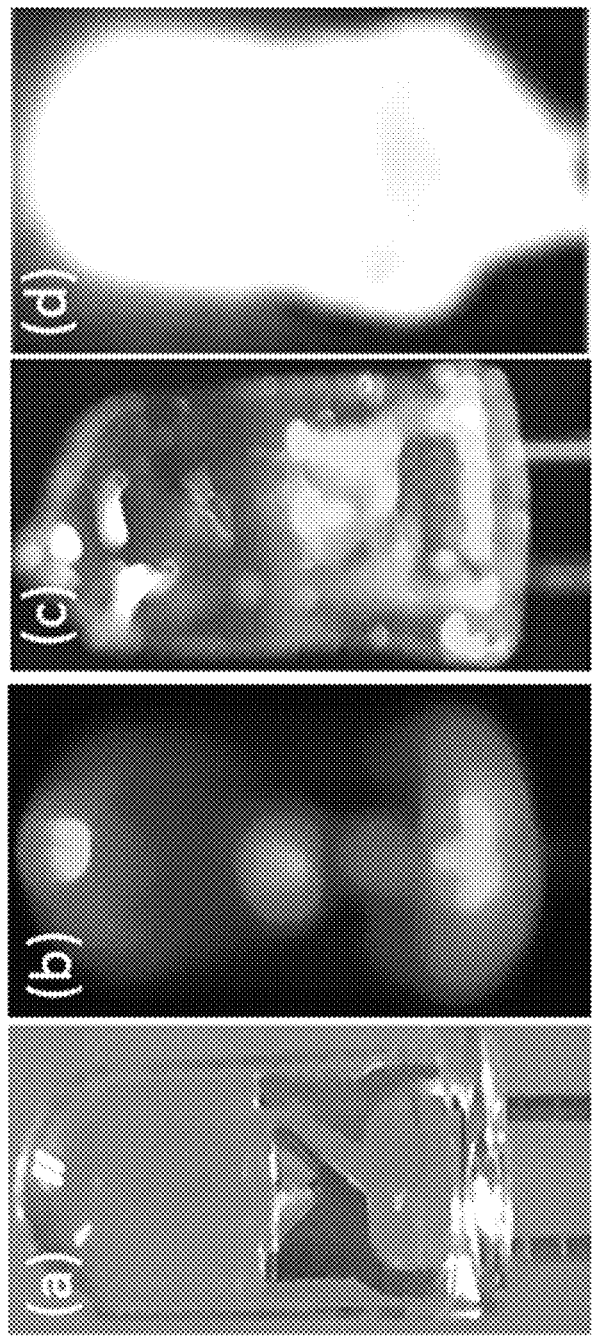
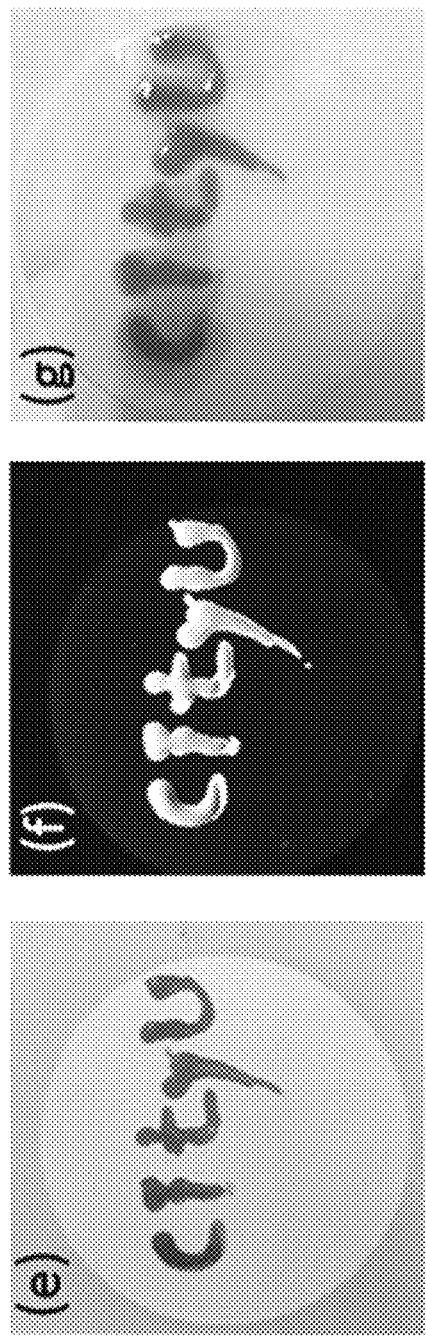
FIG. 15A  FIG. 15B  FIG. 15C  FIG. 15D
FIG. 15E  FIG. 15F  FIG. 15G

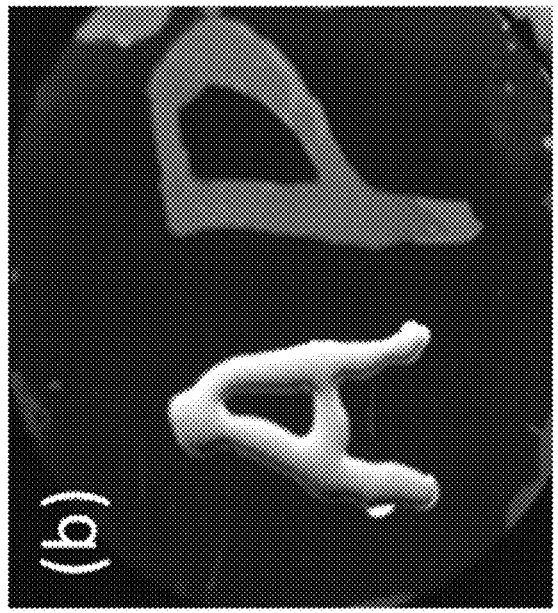
FIG. 16A
FIG. 16B
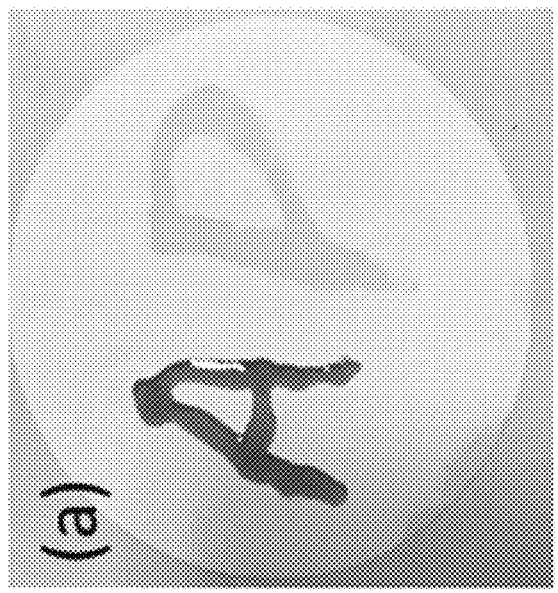
FIG. 16C
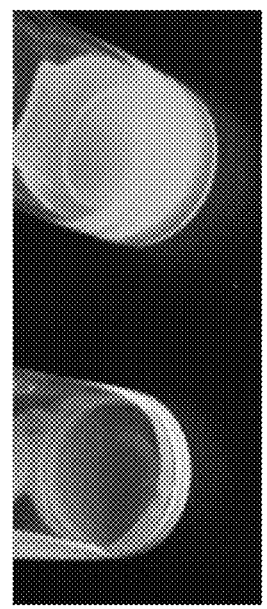
FIG. 16D
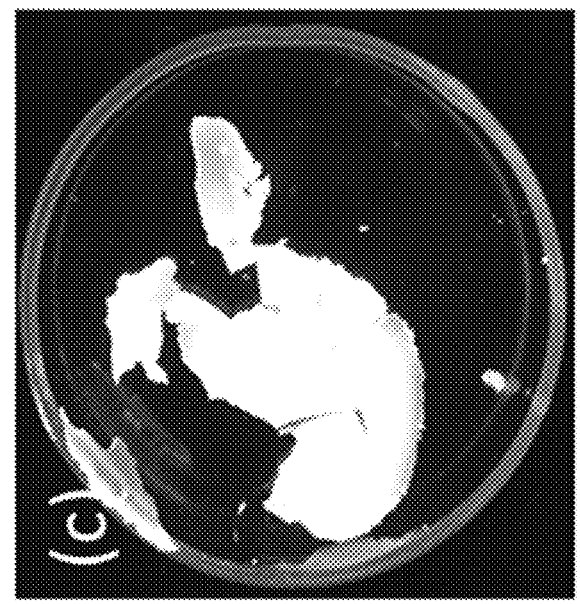

MATERIAL FOR AN ELECTRONIC DEVICE

TECHNICAL FIELD

The present invention relates to a material for an electronic device and a method for fabricating the material, although not exclusively, to a bio-compatible material for a light emitting device.

BACKGROUND

Electronic or electrical lighting devices such as light emitting diodes may be used in various applications. According to different applications, lighting devices with different colors may be used.

Some light emitting diodes may emit white light which may be used for illumination purposes. For example, a lighting device including multiple white LEDs may be used as illumination sources in premises which facilitate human activities. In some other examples, light sources in white color may be also required in other applications or appliances such as microscopic imaging, endoscopes, video capturing in low light condition, etc.

SUMMARY OF THE INVENTION

In accordance with a first aspect of the present invention, there is provided a material for an electronic device, comprising: a substance arranged to emit light in a predetermined range of wavelength upon receiving an excitation energy, wherein the substance includes a plurality of carbon nitride particles and a siloxane material.

In an embodiment of the first aspect, the predetermined range of wavelength includes a range of wavelength visible to human eye.

In an embodiment of the first aspect, the light emitted by the substance is in white color visible to human eye.

In an embodiment of the first aspect, the excitation energy includes a photon excitation.

In an embodiment of the first aspect, the excitation energy includes ultra-violet light.

In an embodiment of the first aspect, the photon excitation has a range of excitation wavelength of 345 nm to 365 nm.

In an embodiment of the first aspect, the photon excitation is at least partially absorbed by the plurality of carbon nitride particles and/or the siloxane material.

In an embodiment of the first aspect, the plurality of carbon nitride particles includes $C_3N_4$ particles.

In an embodiment of the first aspect, each of the plurality of carbon nitride particles is of a size in a range of 1 nm to 1000 nm.

In an embodiment of the first aspect, the siloxane material includes N-(β-aminoethyl)-g-aminopropylmethyldimethoxysilane.

In an embodiment of the first aspect, the each of the carbon nitride particles and the siloxane material is arranged to at least partially contribute the light emitted by the substance.

In an embodiment of the first aspect, the plurality of carbon nitride particles is arranged to contribute a first emission spectrum of blue color within the predetermined range of wavelength of the light emitted by the substance.

In an embodiment of the first aspect, the siloxane material is arranged to contribute a second emission spectrum within the predetermined range of wavelength of the light emitted by the substance such that the light emitted by the substance is in white color visible to human eye.

In an embodiment of the first aspect, at least one of the plurality of carbon nitride particles is functionalized by the siloxane material.

In an embodiment of the first aspect, the substance is a solid.

In an embodiment of the first aspect, the substance is flexible.

In an embodiment of the first aspect, the substance is adhesive.

In an embodiment of the first aspect, the substance is bio-compatible.

In an embodiment of the first aspect, the electronic device is a light-emitting device or a sensor.

In an embodiment of the first aspect, the plurality of carbon nitride particles is further arrange to operate as a photocatalyst.

In an embodiment of the first aspect, the photocatalyst is arranged to degrade an organic substance when upon the substance receives the excitation energy.

In accordance with a second aspect of the present invention, there is provided a method of producing a material for an electronic device, comprising the steps of: synthesizing a plurality of carbon nitride particles; and mixing a siloxane material to the plurality of carbon nitride particles to form a substance; and wherein the substance is arranged to emit light in a predetermined range of wavelength upon receiving an excitation energy.

In an embodiment of the second aspect, the step of synthesizing the plurality of carbon nitride particles comprises the step of mixing citric acid with thiourea to form a precursor of the plurality of carbon nitride particles.

In an embodiment of the second aspect, the method further comprises the step of heating the precursor at 120° C. to 300° C.

In an embodiment of the second aspect, the method further comprises the step of filtering out the plurality of carbon nitride particles from the precursor.

In an embodiment of the second aspect, the method further comprising the step of heating the substance at 120° C. to 300° C.

In an embodiment of the second aspect, the method further comprises the step of solidifying the substance to form a thin film.

In accordance with a third aspect of the present invention, there is provided a light emitting device, comprising a light emitting element arranged to emit an excitation energy; and a material having a substance arranged to emit light in a predetermined range of wavelength upon receiving the excitation energy, wherein the substance includes a plurality of carbon nitride particles and a siloxane material.

In an embodiment of the third aspect, the light emitting element includes a light emitting diode.

In an embodiment of the third aspect, the substance is a thin film at least partially covering the light emitting element.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

Embodiments of the present invention will now be described, by way of example, with reference to the accompanying drawings in which:

FIG. 11 is a photographic image showing a thin film of the material for an electronic device in accordance with an embodiment of the present invention;

FIG. 12 is a photographic image illustrating a flexibility of the thin film of the material in FIG. 11;

FIG. 13 is a photographic image showing a light emitting device in accordance with an embodiment of the present invention, wherein the light emitting device is attached to a fabric material;

FIG. 14 is a photographic image showing the light emitting device of FIG. 13 wherein the light emitting device is lighted up;

FIGS. 15A, 15B, 15C, and 15D are photographic images of a blue LED (FIG. 15A) without the silica gel coated and is off, (FIG. 15B) without the silica gel coated and is on, (FIG. 15C) with the silica gel coated and is off, and (FIG. 15D) with the silica gel coated and is on respectively;

FIG. 15E is a photographic image of a calligraphy written using the freshly prepared g-C$_3$N$_4$-silica-gels as ink on a piece of filter paper;

FIGS. 15F and 15G are photographic images of the calligraphy of FIG. 15E, when (FIG. 15F) illuminated with a hand-held UV lamp (365 nm) and (FIG. 15G) after dipped in water for five times;

FIGS. 16A to 16B are photographic images of a calligraphy written using the freshly prepared g-C$_3$N$_4$-silica-gel (letter "A") and pure g-C$_3$N$_4$ nanodots (letter "P") as ink on a piece of filter paper;

FIG. 16C is a photographic image of a thin film of partially aged g-C3N4-silica-gels (aged for 40 min); and FIG. 16D is a photographic image of a comparison of g-C$_3$N$_4$-silica-gels of the left and g-C$_3$N$_4$ nanodots on the right.

DETAILED DESCRIPTION OF THE PREFERRED EMBODIMENT

The inventors have, through their own research, trials and experiments, devised that white LED coatings for use in blue or ultra-violet LEDs may be made by mixing fluorescent powders (such as phosphor) with a polymer matrix. The coatings may include heavy metals and toxic organic species. Some of the conventional white LED techniques may suffer from low-efficiency, high toxicity and pollution, imposes potential risks to the health of manufacturing workers (e.g., possible airway inhalation of toxins), and its development is largely limited by the low abundance of the raw materials. Furthermore, due to the toxicity of these components, disposal of the used conventional LED products is not environmental-friendly.

White light-emitting diodes (WLEDs) have advantages over conventional lighting devices such as long lifetime, low power consumption, fast response, and high luminous efficiency. As one example, WLED materials may be based on a In—GaN blue-emitting chip mixed with Ce$^{3+}$:Y$_3$Al$_5$O$_{12}$ (Ce:YAG) yellow phosphor dispersed in epoxy resin or silicone. Alternatively, transition metal ion-doped semiconductor quantum dots include optical properties suitable for WLED applications. However, these WLED materials generally contain hazardous substances such as CdTe, CdSe, CuInS, PbS and CdS, raising toxicity and pollution concerns.

In some alternative examples, WLED materials may be based on carbon species by combining several carbon-based light-emitting materials of different emission wavelength. For example, LED materials may be synthesized by combining carbon and zinc copper indium sulfide quantum dots, or by blending silica/carbon dots (blue emission) with CdS nanocrystals (yellow emission). Alternatively, transparent polysiloxane-functionalized carbon dots (yellow emission) may be coated on the GaN bulb (blue emitting) to enable white light emission. However, some of these mixing strategies may be complex and time-consumable. Furthermore, some of these carbon-based WLED materials may contain toxic metal components.

Figure 1:
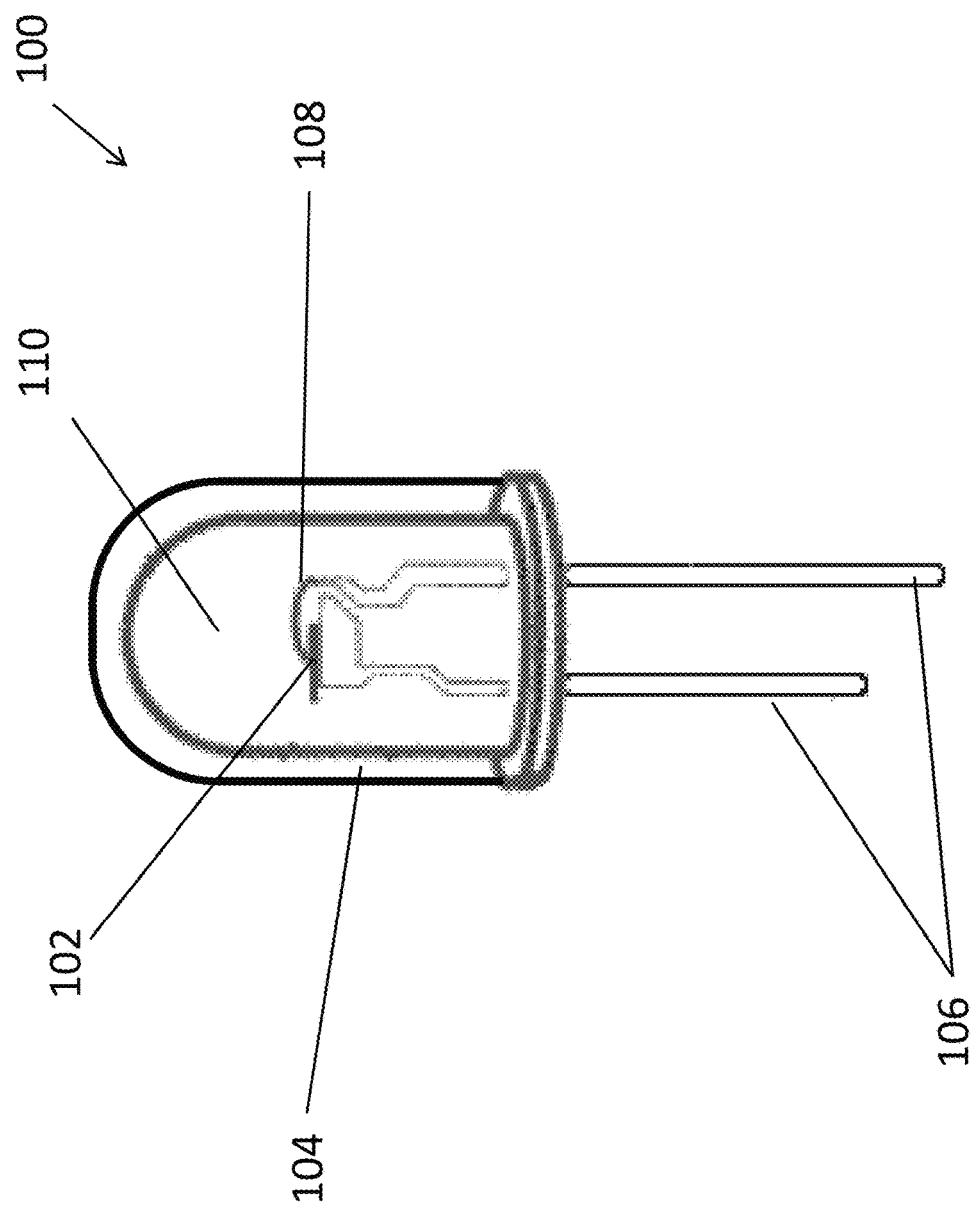
FIG. 1 is a perspective view of a light emitting device in accordance with one embodiment of the present invention.

With reference to FIG. 1, there is shown an embodiment of a light emitting device 100, comprising a light emitting device 102 arranged to emit an excitation energy; and a material 104 having a substance arranged to emit light in a predetermined range of wavelength upon receiving the excitation energy, wherein the substance includes a plurality of carbon nitride particles and a siloxane material.

In this embodiment, the light emitting device 100 is an electronic device, such as light emitting diode (LED) comprising a conventional LED structures such as the anode and cathode electrodes 106, a light emitting device 102 such as an LED chip, internal wiring 108 arranged to connects the LED chip 102 to the electrodes 106 and an encapsulation 110 arranged to encapsulate the LED chip 102, the internal wiring and at least a portion of the electrodes 106 and to fix their positions. During normal operation, electrical voltage bias may be applied to the light emitting device 100 to power up the light emitting device 102 via the electrodes 106 and the wiring provided, the light emitting device 102 emits an excitation energy such as photons or an electromagnetic radiation, which may be observed by a human eye as light if the wavelength of the emitting energy is within a range visible to a human eye.

Alternatively, the light emitting device 102 may include other types of light sources, such as but not limited to a LASER diode, a light filament, a fluorescent tube, etc.

The light emitting device 100 further comprises a material or coating 104 having a substance for converting the electromagnetic radiation to light. The emitted light may include one or more electromagnetic wave at different wavelengths, such that the light emitted by the material 104 or the substance appears to be in different color to a human eye.

For example, the material 104 or the included substance may absorb all of the excitation energy in form of a photon excitation having a range of excitation wavelength of 345 to 365 nm generated by the LED chip 102, which corresponds to ultra-violet light in the electromagnetic wave spectrum, and then emit light covering at least a range of wavelengths in the spectrum visible to human eyes (typically 400-700 nm) and appearing to be in white color visible to an human eye.

Alternatively, the emitted light may appear to be in different color which includes at least one of the red, blue and green components in different intensities. Alternatively, the emitted light may be invisible to a human eye.

Preferably, the substance may be provided in a thin film 104 partially or entirely covering the light emitting device 102 or travelling paths of the excitation energy generated by the light emitting device 102. The thin film 104 may be of different thickness or coverage based on different requirements. For example, a thicker film 104 including more of the material or the substance to covert more photon excitations to light in the desire spectrum within the predetermined range of wavelength of light emitted by the substance. Alternatively, a thinner film of material 104 may be included to allow certain amount of the photon excitations generated by the light emitting device 102 to pass through and escape to the external environment, thus a part of the generated photon excitations also contribute the light emitted by the electronic device 100. Alternatively, at least a part of the light emitting device 100 is not covered by the thin film 104 so as to allow the transmission of the generated photon excitations to external environment.

During the conversion, the substance in the thin film 104 may be excited by the excitation energy (such as photon energy) and is in an excited state, subsequently, the substance then emit an output energy matching one or more energy band gaps of the substance and return back to a metastable state. The output energy may be in a form of a photon or an electromagnetic wave having a wavelength according to the energy band gap of the material 104 or the substance. Therefore, when the substance is excited continuously, continuous wave of electromagnetic energy is emitted by the substance.

Preferably, the substance includes carbon nitride particles and a siloxane material that may be used to absorb photons and emit lights or radiations with different wavelengths, and the combination of the carbon nitride particles and the siloxane material may form a silica gel which may be coated on a surface of a structure.

Figure 2:
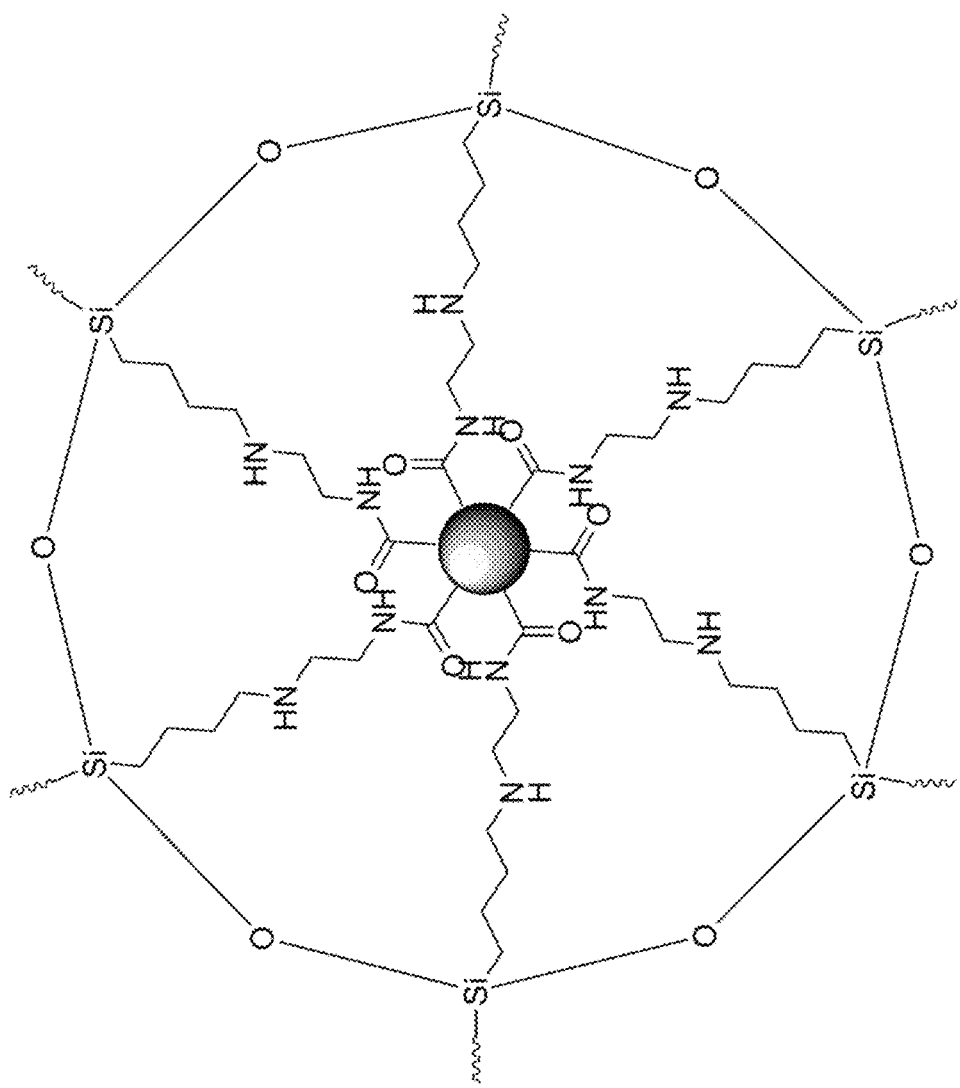
FIG. 2 is a schematic drawing of an AEATMS-capped C$_3$N$_4$ particle with multiaminosilane-functionalized surface in the substance of material of the light emitting device of FIG. 1.

With reference to the example structure as shown in FIG. 2, the carbon nitrides particles may include $C_3N_4$ particles for converting at least part of the excitation energy generated by the light emitting device 102 to a part or all of the light output of the electronic device 100. Preferably, such output may include a first emission spectrum of blue color within the predetermined range of wavelength of the light emitted by the substance.

In addition, the substance further includes a siloxane material such as N-(β-aminoethyl)-g-aminopropylmethyl-dimethoxysilane (AEATMS). The siloxane material may functionalize the carbon nitride particles, and may also absorb excitation energy and emit light which may be in different wavelengths compared to that of the excitation energy. For example, the siloxane material may contribute a second emission spectrum (which may include color of green and red) within the predetermined range of wavelength of the light emitted, such that the light emitted by the substance is in white color visible to human eye when the light includes the red and green light contributed by the siloxane material and the blue light contributed by the carbon nitride particles.

Figure 3A:
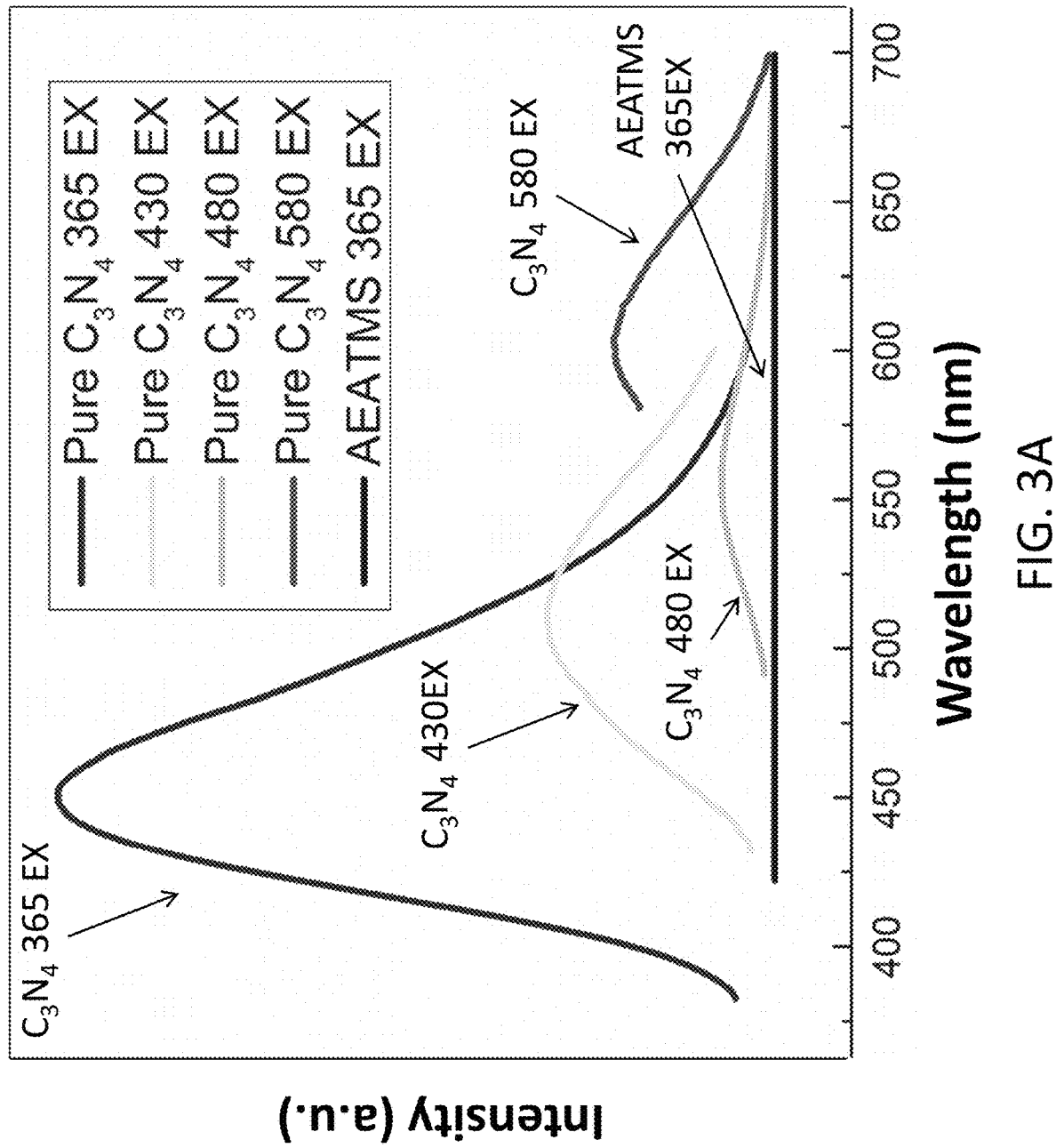
FIG. 3A is a plot showing a photoluminance spectrum of pure C$_3$N$_4$ material being excited at 365 nm, 430 nm, 480 nm and 580 nm respectively, and the AEATMS material being excited at 365 nm.
Figure 3B:
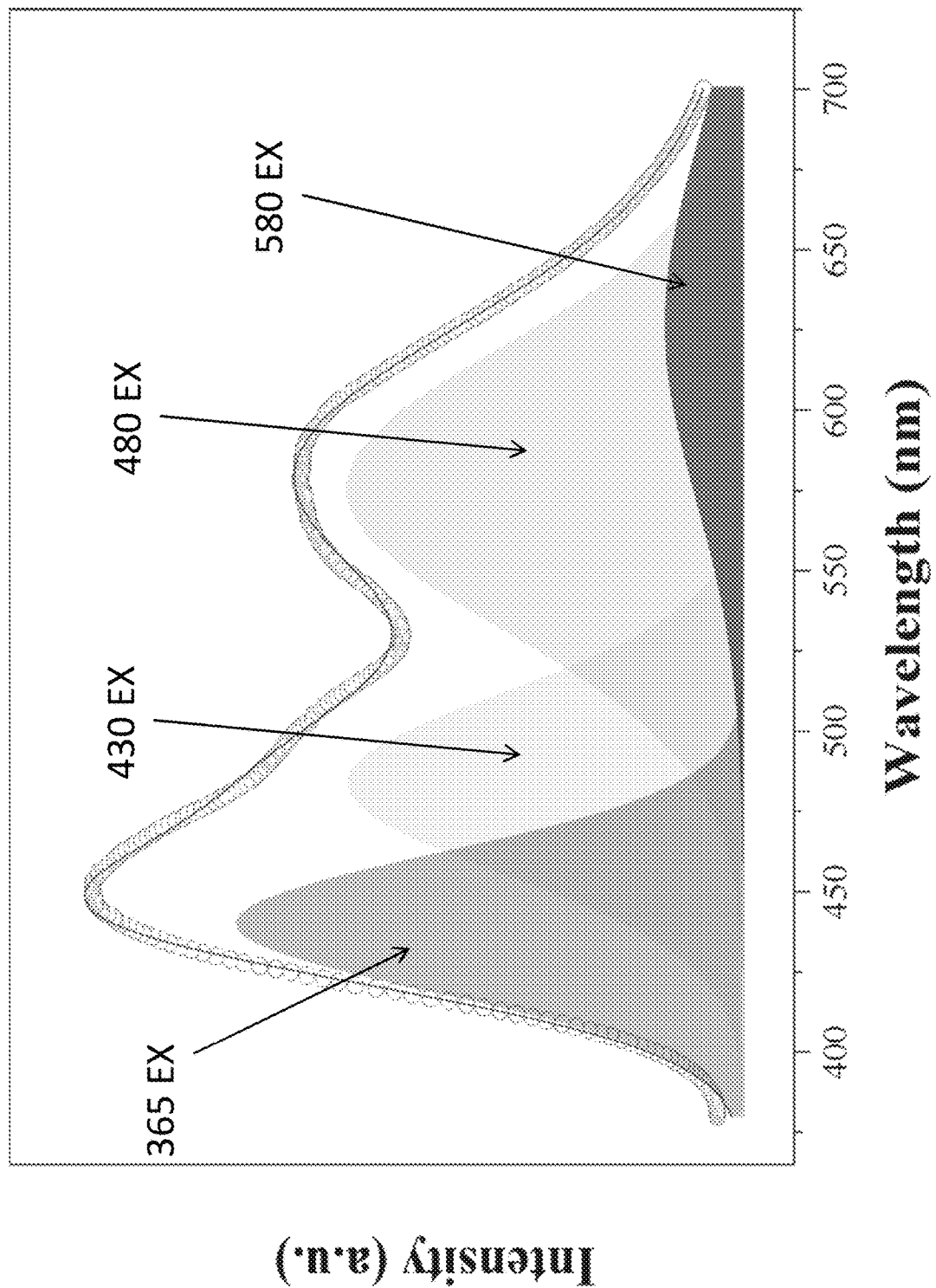
FIG. 3B is plot showing a photoluminance spectrum of the substance of material of the light emitting device of FIG. 1 excited at 365 nm.

With reference to FIGS. 3A and 3B, there is shown a measurement result of an operation of the electronic device 100 or the light emitting device in accordance with the embodiments of the present invention. In this example, the material 104 or the substance is illumination by a UV-LED chip (365 nm excitation). The light emitted by the substance includes four peaks (430, 480, 580, and 627 nm) across the spectrum, which contributes to a white light emission. It is also observed that the emission spectrum of $C_3N_4$ silica gels have red-shift peaks compared to pure C3N4 dots due to self-absorption and spontaneous emission of silica gels (high concentration).

White light emission normally features multiple peaks in the visible region. The obtained g-$C_3N_4$-silica-gels exhibited 4 peaks (430 nm, 480 nm, 580 nm and 627 nm) as shown in FIG. 3B. Considering that the pure g-$C_3N_4$ nanodots possess a single peak at 430 nm as shown in FIG. 3A, the peaks at 480 nm and 580 nm can be attributed to the silica-functionalization of g-$C_3N_4$.

Figure 4:
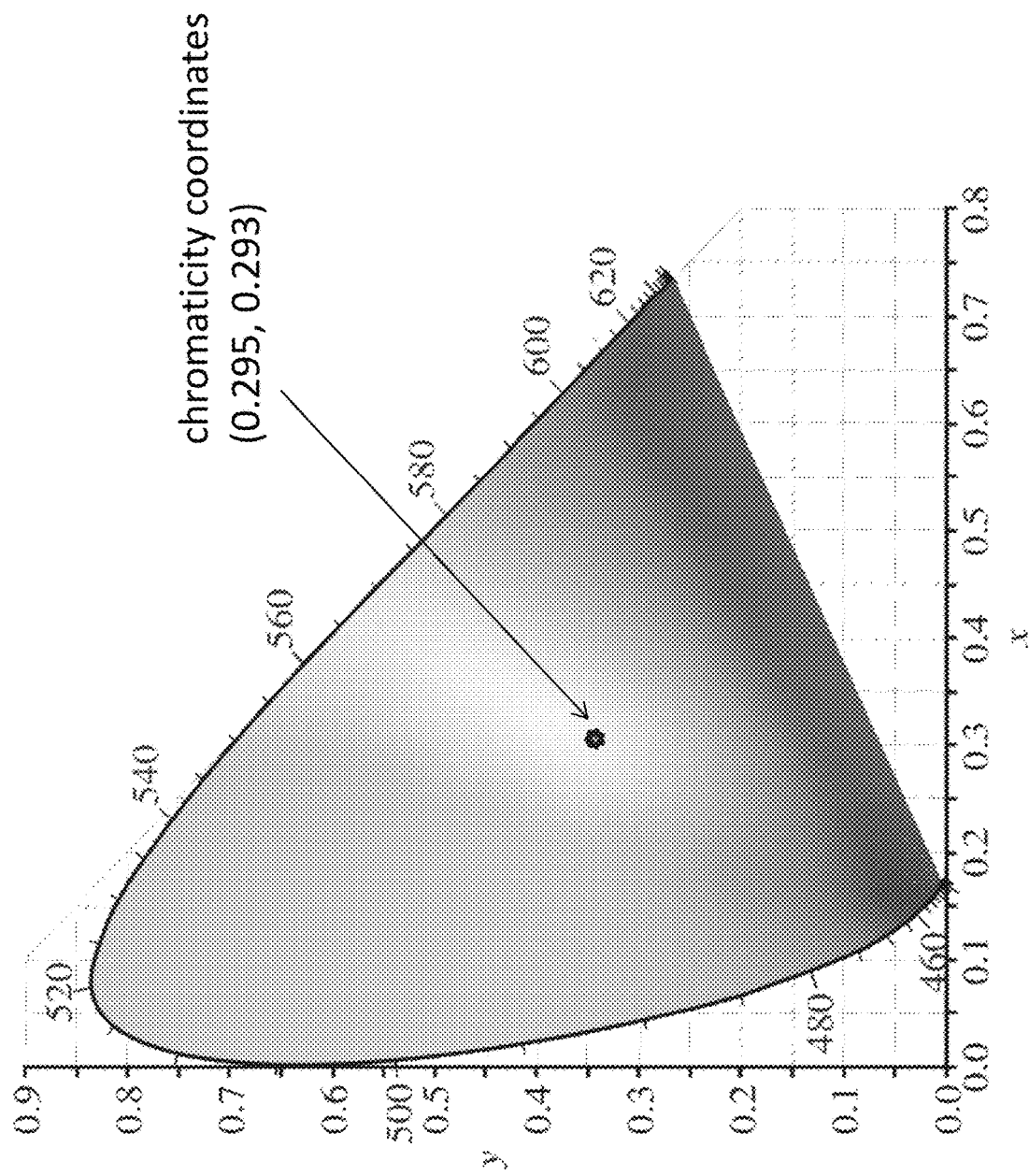
FIG. 4 is a CIE-1931 chromaticity diagram showing the position of the exemplary emission from substance of material of the light emitting device of FIG. 1 excited at 365 nm.

Referring to FIG. 4, the chromaticity coordinates are (0.295, 0.293), as shown in the white gamut, falling within the white gamut of the CIE-1931 color space chromaticity diagram.

The light emitting mechanism of the thin film 104 or the g-$C_3N_4$-silica-gels were investigated. The g-$C_3N_4$-silica-gels turned from dark brown to orange under room light upon aging to form the thin film 104, with its emission simultaneously shifted from green to white under the UV illumination (365 nm) with reference to FIGS. 16A to 16D.

With reference also to FIGS. 3A and 3B, pure silica gel synthesized by heating AEATMS has no photoluminescence under UV light. The intense blue fluorescent peak (430 nm) of the g-$C_3N_4$-silica-gels arises from the nitrogen-rich g-$C_3N_4$, as indicated from the photoluminescence spectrum of the pure g-$C_3N_4$. The blue emission of g-$C_3N_4$ persists after the surface functionalization of silica gel. In addition, the synthesized g-$C_3N_4$-silica-gel has a higher quantum yield (27%) than the synthesized pure g-$C_3N_4$ (18%) due to surface passivation.

The emergence of the emission at 480, 580, and 630 nm of the aged g-$C_3N_4$-silica-gels can be ascribed to the self-excitation effect, i.e., the blue emission at 430 nm upon UV excitation is partially absorbed by the gel itself, exciting photoluminance peak at 490 nm, which is further partially absorbed exciting photoluminance peak at 580 nm, which is again further partially absorbed exciting photoluminance peak at 630 nm. This emission mechanism is supported by the photoluminescence spectra of the pure g-C3N4 excited at 430 nm, 480 nm, and 580 nm.

Figure 5:
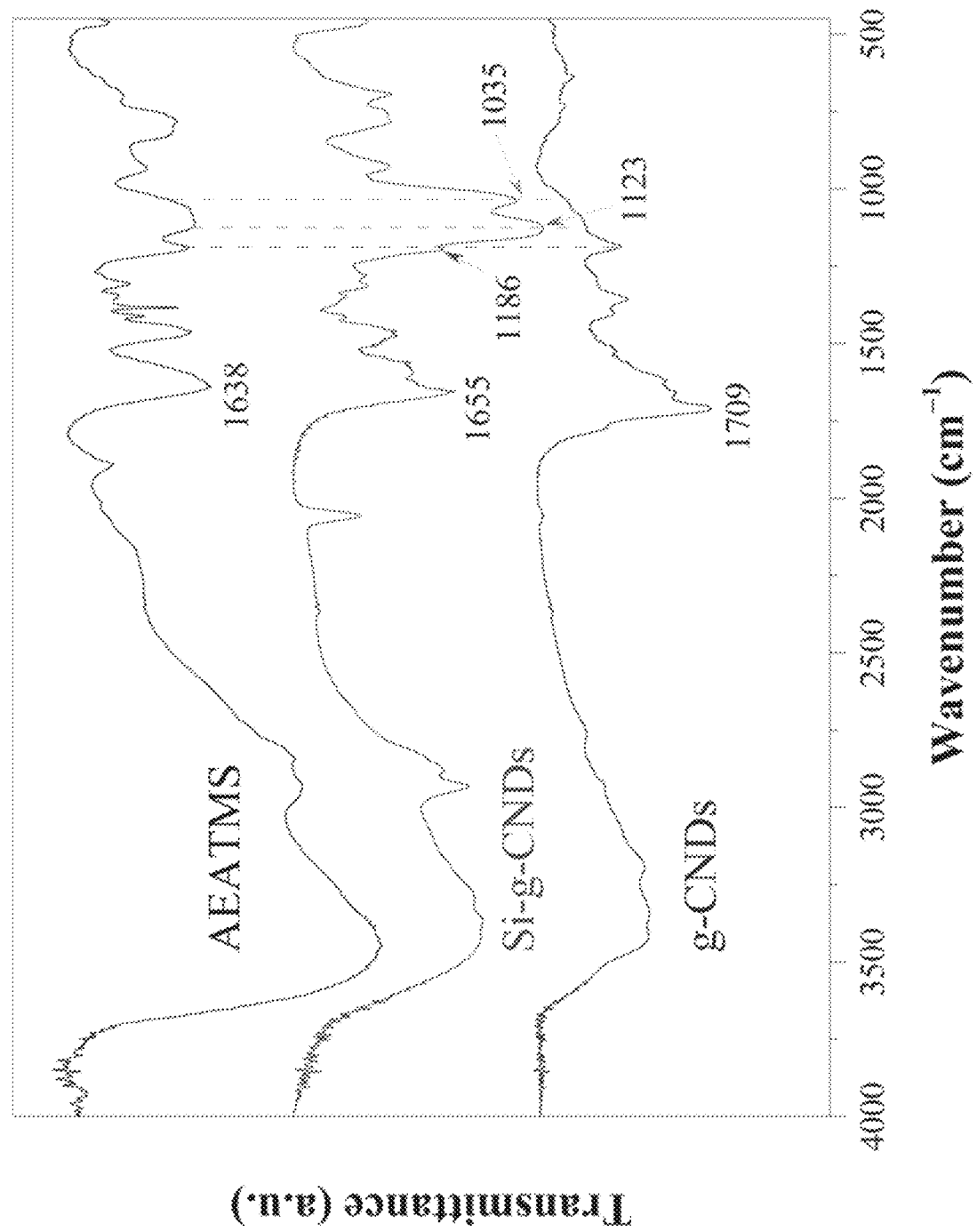
FIG. 5 is a plot showing Fourier transform infrared (FTIR) spectra of AEATMS, the C$_3$N$_4$ silica gel (Si-g-CNDs) and the C$_3$N$_4$ particles (g-CNDs)

With reference to FIG. 5, there is shown an exemplary Fourier transform infrared (FTIR) spectra of AEATMS, the $C_3N_4$ silica gel (Si-g-CNDs) and the $C_3N_4$ particles (g-CNDs). It is indicated in the FTIR that the existence of AEATMS-capped $C_3N_4$ particles in the $C_3N_4$ silica gel, which shows a characteristic peak at 1655 cm$^{-1}$ assigned to the stretching vibration of C=O groups from the C=ONH units and two signals at 1035 and 1123 cm$^{-1}$ assigned to the Si—O—C and Si—O—Si vibrations respectively.

Figure 6:
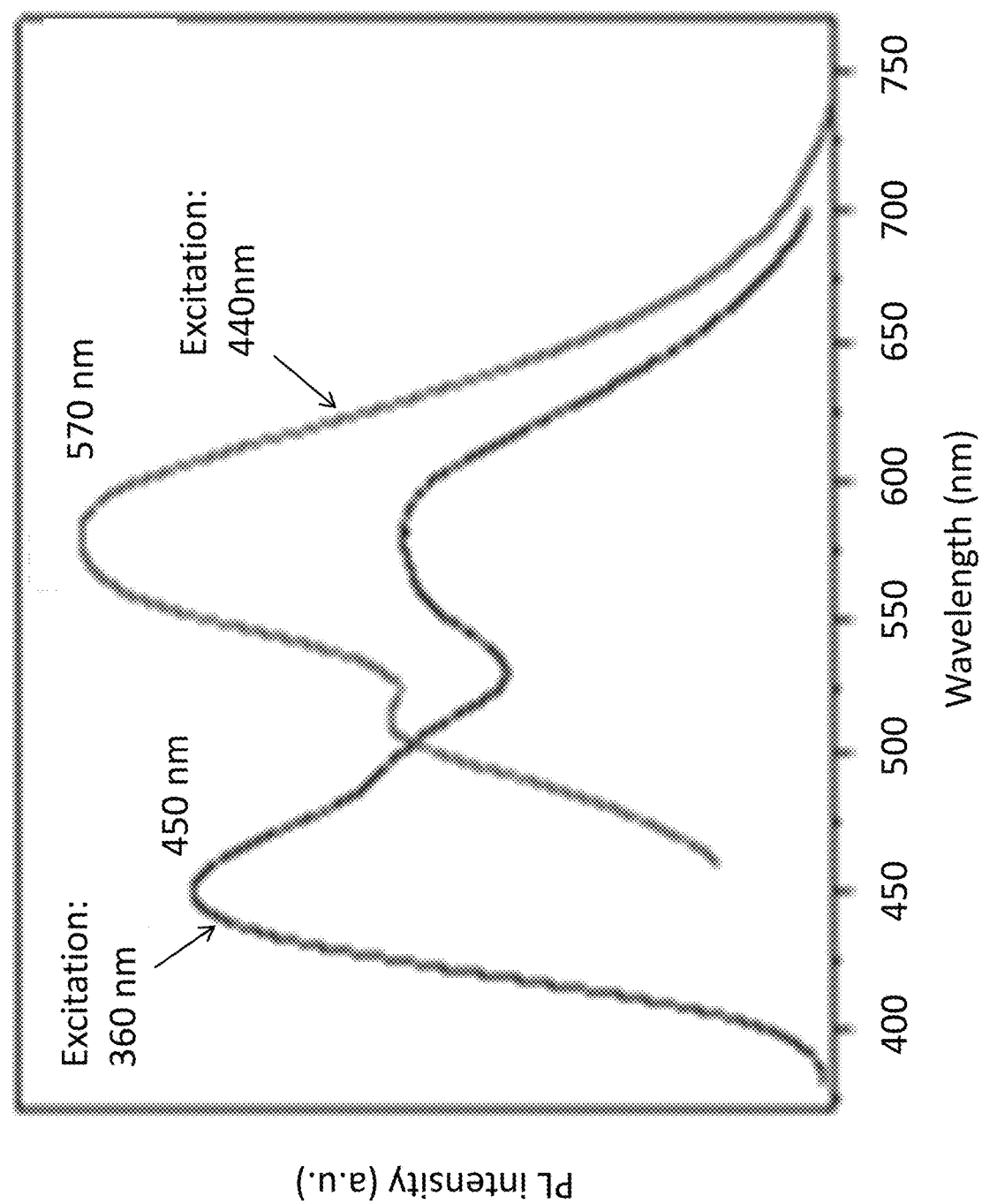
FIG. 6 is a plot showing a comparison between the photoluminescence responses of the substance of material of the light emitting device of FIG. 1 under excitation of light in 360 nm and 440 nm.
Figure 7A:
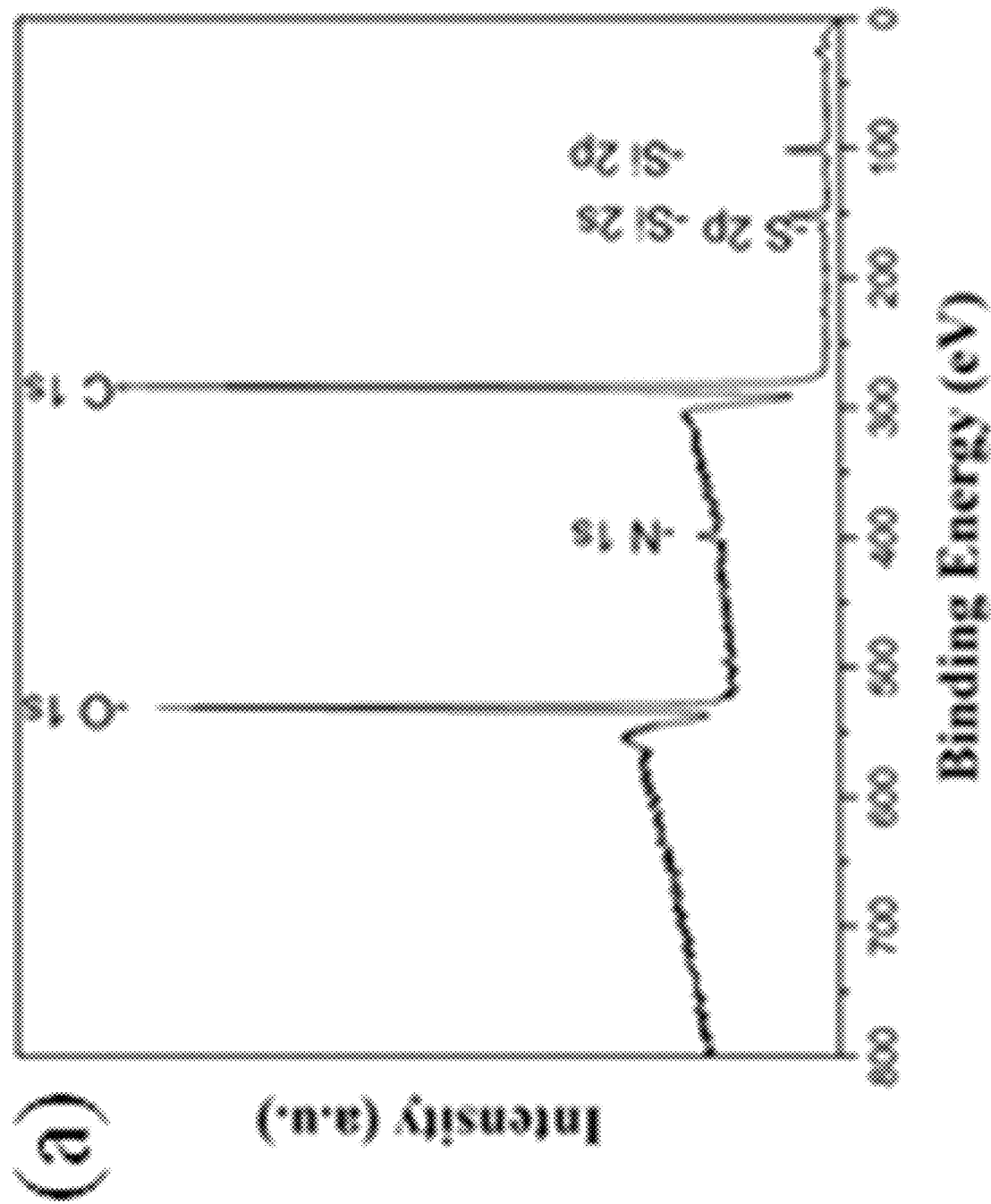
FIGS. 7A, 7B, 7C, and 7D are plots respectively showing (FIG. 7) all, (FIG. 7B) C is, (FIG. 7C) N 1s and (FIG. 7D) Si 2p spectra in an XPS characterization of g-C$_3$N$_4$-silica-gels.
Figure 7B:
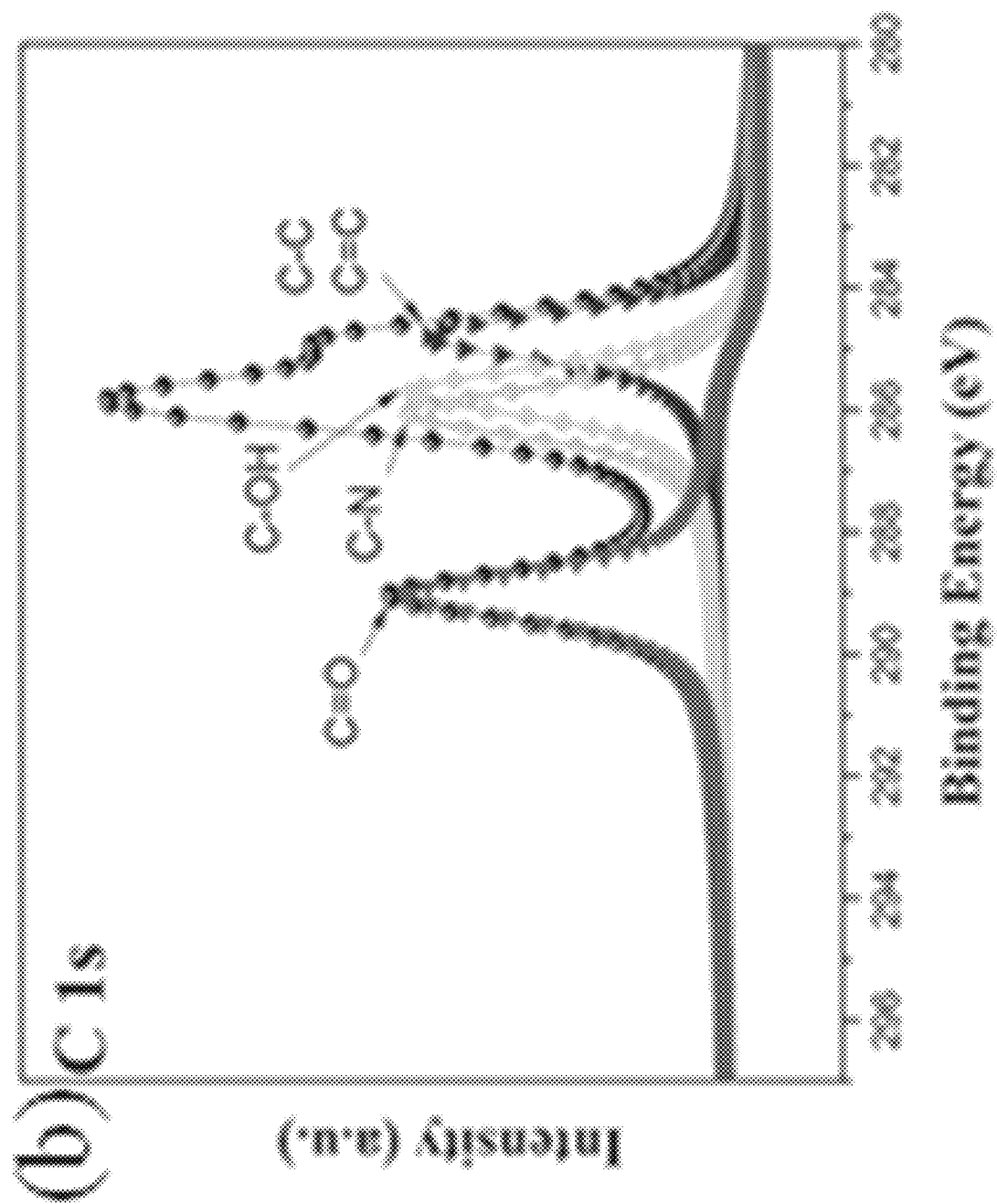
Figure 7C:
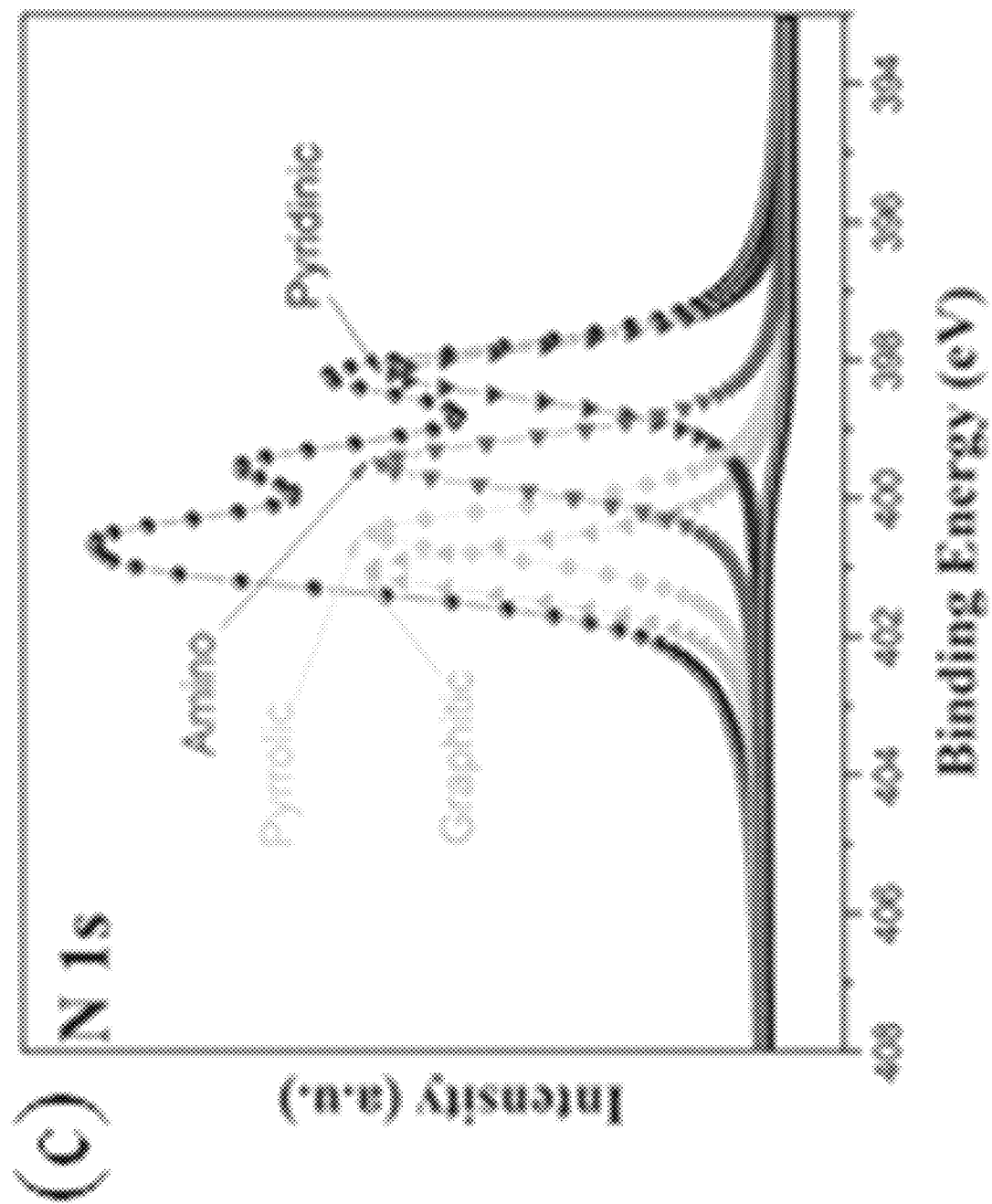
Figure 7D:
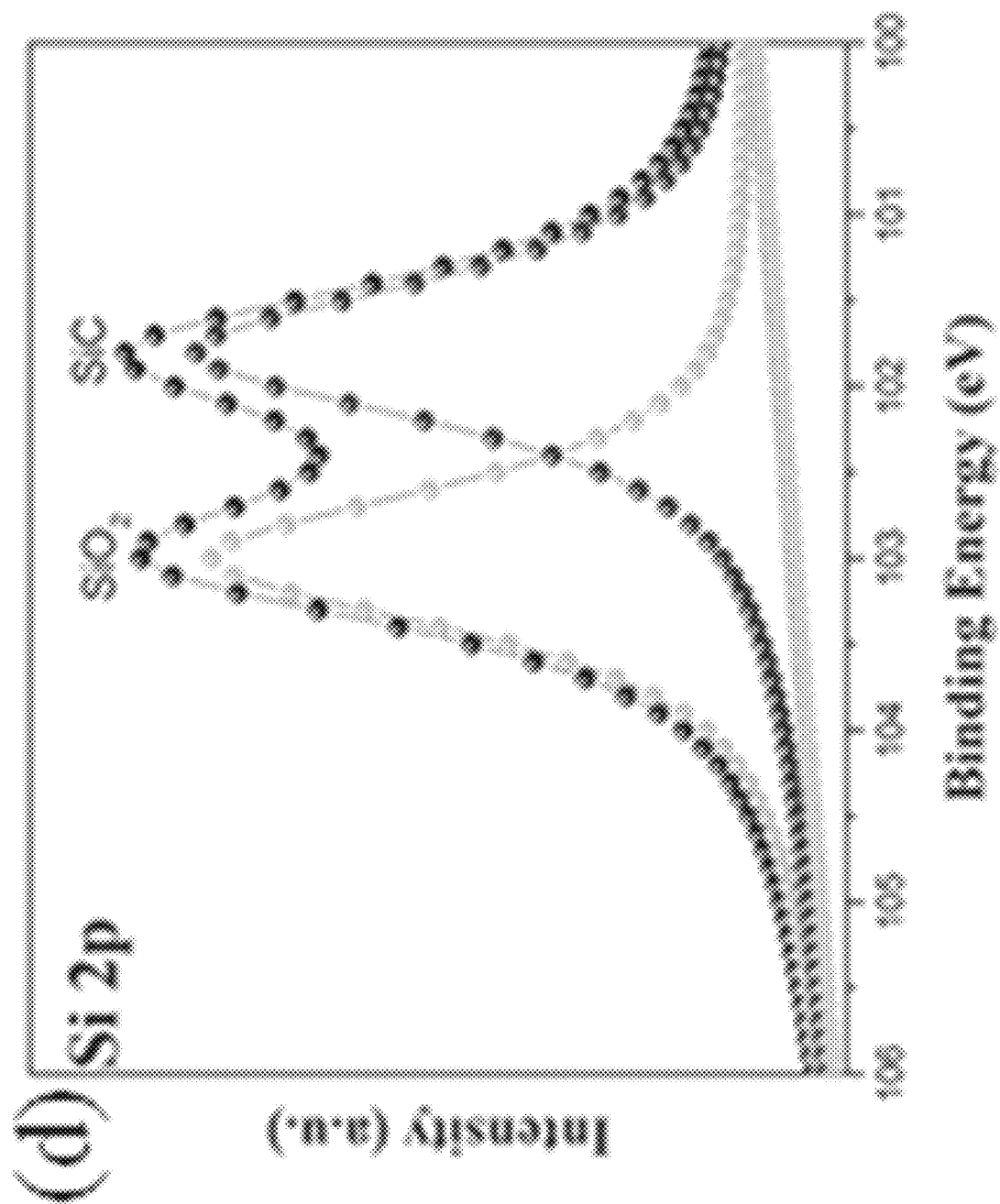
Figure 8A:
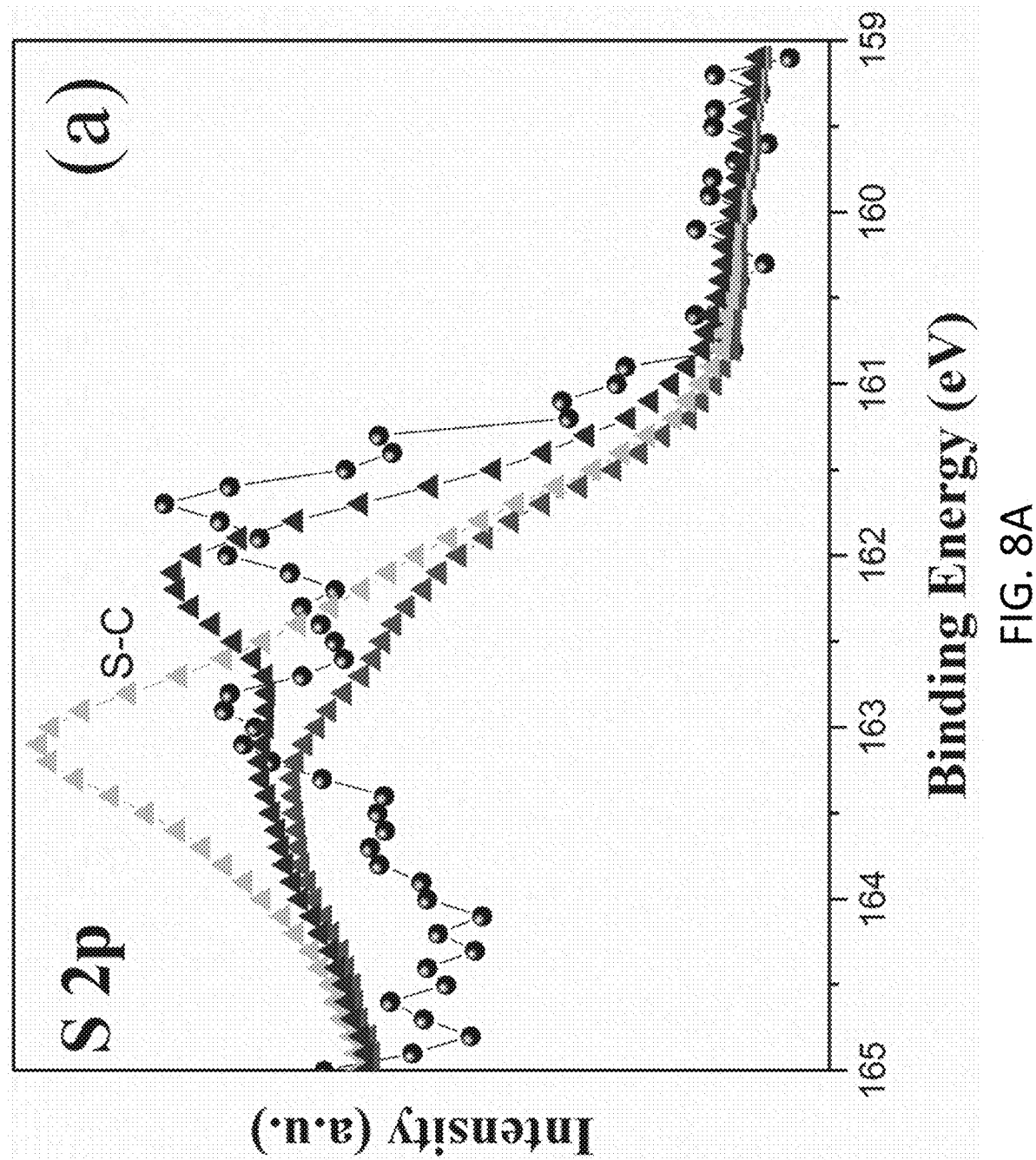
FIGS. 8A and 8B are plots respectively showing (a) Si 2p and (b) S 2p spectra in an XPS characterization of g-C$_3$N$_4$-silica-gels.
Figure 8B:
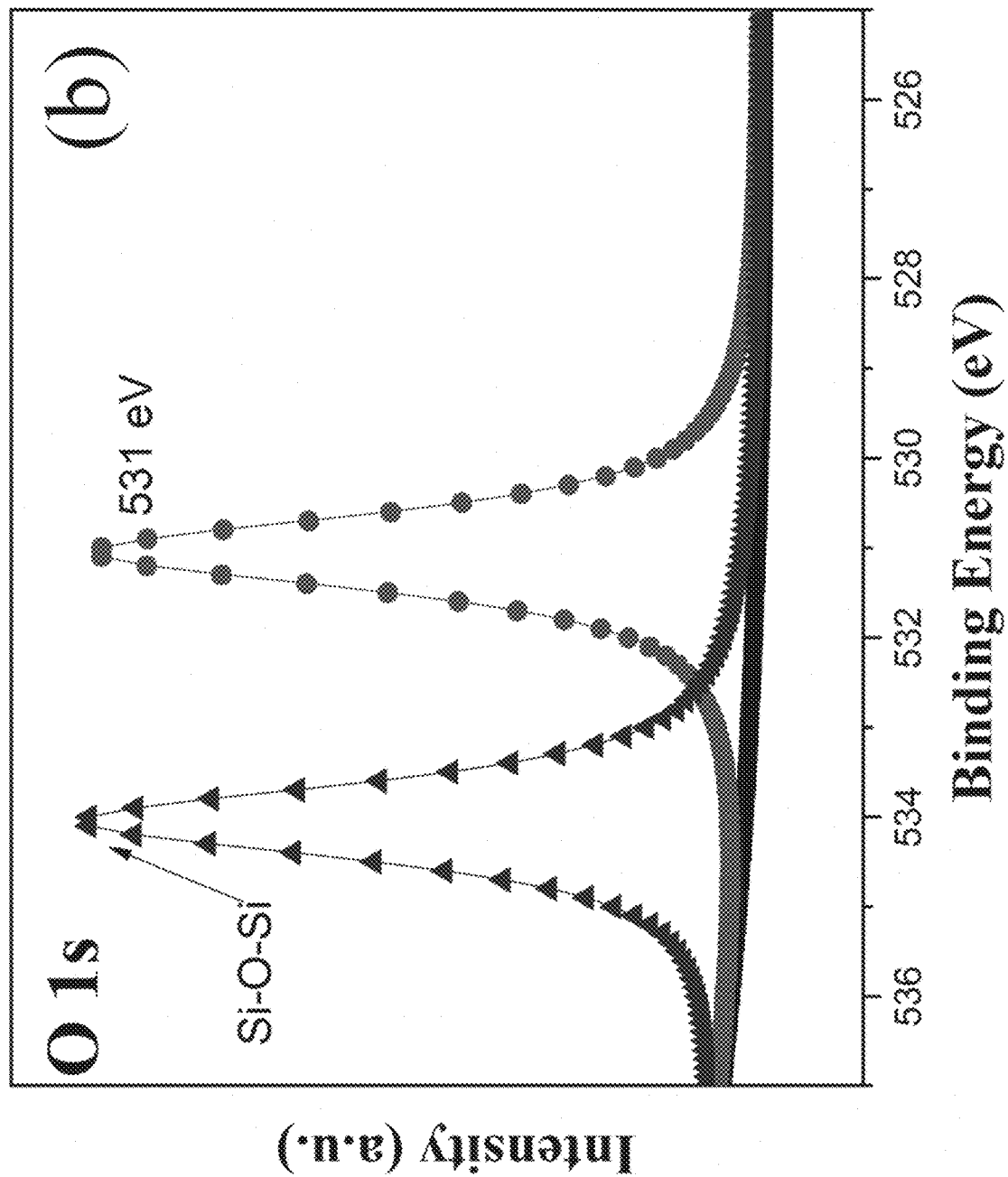

In an alternative example, the material 104 or the substance may be excited by light of different color. With reference to FIG. 6, different color can be obtained from the $C_3N_4$ silica gel 104 by different excitation wavelengths. For example, when the material is excited by light with a wavelength of 440 nm, yellowish orange light with an emission peak at 570 nm is emitted by the substance. It is observed by the inventor that as the ratio of C/N increased, the peak is red shifted. Therefore, desire color of the light emitted by the substance may be accurately and flexibly obtained by tuning the C/N ratio and or the composition of the silica gel. Other parameters may also affect the emission color/temperature. For example, the surface state of the substance may also affect luminescence of the light emit by the substance.

Due to their special semiconductor properties, such as having an energy band gap of 2.7 eV, visible light absorption and high stability, the $C_3N_4$ particles may operate as a photocatalyst. For example, the material 104 or the substance may combine with other photocatalysts or substances such as titania to achieve further improved photocatalytic performance. In this example, the photocatalyst may degrade an organic substance (such as a volatile organic compound) when upon the substance receives an excitation energy.

Besides, $C_3N_4$ is also an electron acceptor material with high luminescence that may be used in sensors. In an example embodiment, the electronic device is a sensor where different metal ions may show different impact on the emission spectrum of the $C_3N_4$ particles, thus $C_3N_4$ particles may be used in electronic devices for detecting metal ions.

With reference to FIGS. 7A to 8B, there is shown an example analysis of the g-$C_3N_4$-silica-gels using X-ray photo-electron spectroscopy (XPS). The full scan spectra of the samples showed five peaks at ~102 eV, 161 eV, 288 eV, 399 eV, and 531.5 eV, which can be assigned to S 2p, Si 2p, C1s, N1s, and O1s, respectively. The detailed C 1s scan revealed a peak located at 284.8 eV which was assigned to the sp2 C—C bonds of 286.4 eV corresponding to the sp2 C—N bond (each carbon atom bonded to 3 nitrogen atoms in the g-$C_3N_4$ lattice), and peaks located at 285.7 eV and 289.2 eV which respectively were assigned to the C—OH bond and C—O bond, indicating the existence of oxygen-rich groups. Four features at 398.2 eV (pyridinic), 399.7 eV (amino), 400.8 eV (pyrrolic), and 401.3 eV (graphitic) were observed in the N 1s spectrum, convincing of g-C3N4 particles feature heptazine heterocyclic rings. Two peaks at 103.1 eV (assigned to the Si—O bond) and 101.7 eV (assigned to the Si—C bond) were present in the Si 2p spectrum, in good agreement with the O 1s scan which exhibited a peak at 534 eV corresponding to the Si—O—Si bonds. Together with the FTIR results discussed earlier and illustrated in FIG. 5, the XPS analysis confirms that the presence of the silica functionalized g-$C_3N_4$ in the g-$C_3N_4$-silica-gels.

Preferably, the method of producing such material for an electronic device 100 or a light emitting device 100 may comprise the steps of: synthesizing a plurality of carbon nitride particles; and mixing a siloxane material to the plurality of carbon nitride particles to form a substance.

For example, $C_3N_4$ nanodots or particles may be synthesized by mixing citric acid with thiourea to form a precursor of the carbon nitride particles. The precursor may include a mixture of 0.41 g of anhydrous citric acid and 0.42 g thiourea. The precursor may then be heated at 120-300° C., preferably at 180° C., for a predetermined period such as 2 hours to produce the $C_3N_4$ particles. The $C_3N_4$ particles may be filtered out from the precursor. Preferably, the synthesized carbon nitride particles are of a size in a range of 1 nm to 1000 nm.

Alternatively, to collect the nanodots from the precursor, the mixture may be dissolved in water, sonicated for 30 minutes, and then stirred for an hour. The g-$C_3N_4$ particles may then be collected by centrifugation at 12,000 rpm for 10 minutes followed by water rinsing (and optionally repeated for 3 times). The solid precipitation was then filtered through a 14,000 Da dialysis bag washed with deionized water to collect only the g-C3N4 nanodots.

Figure 9A:
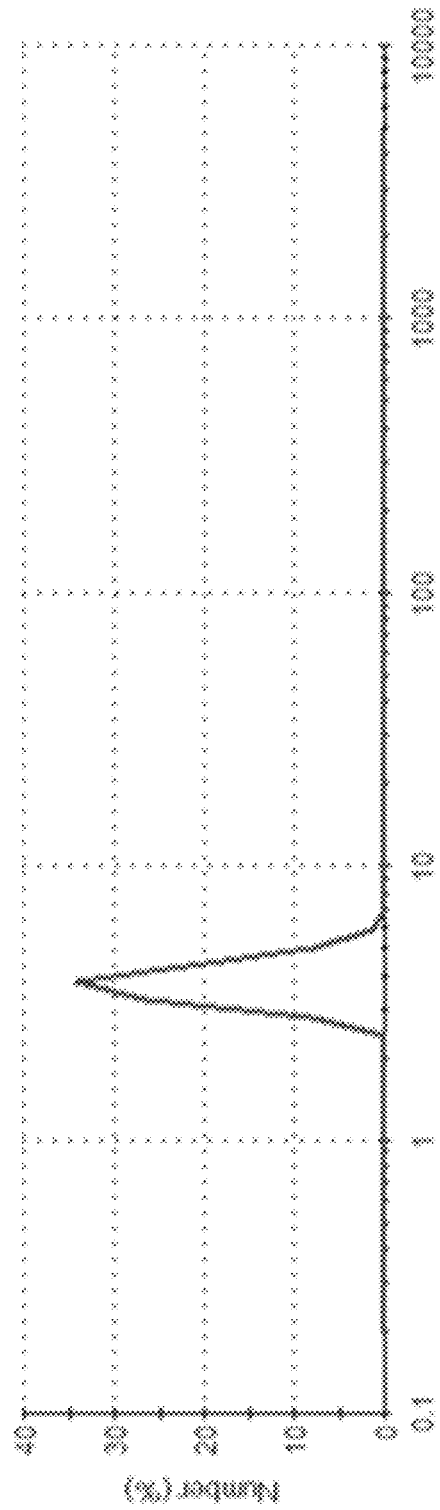
FIGS. 9A and 9B are plots respectively showing DLS particle size distributions of the g-C$_3$N$_4$ nanoparticles after and before dialysis.
Figure 9B:
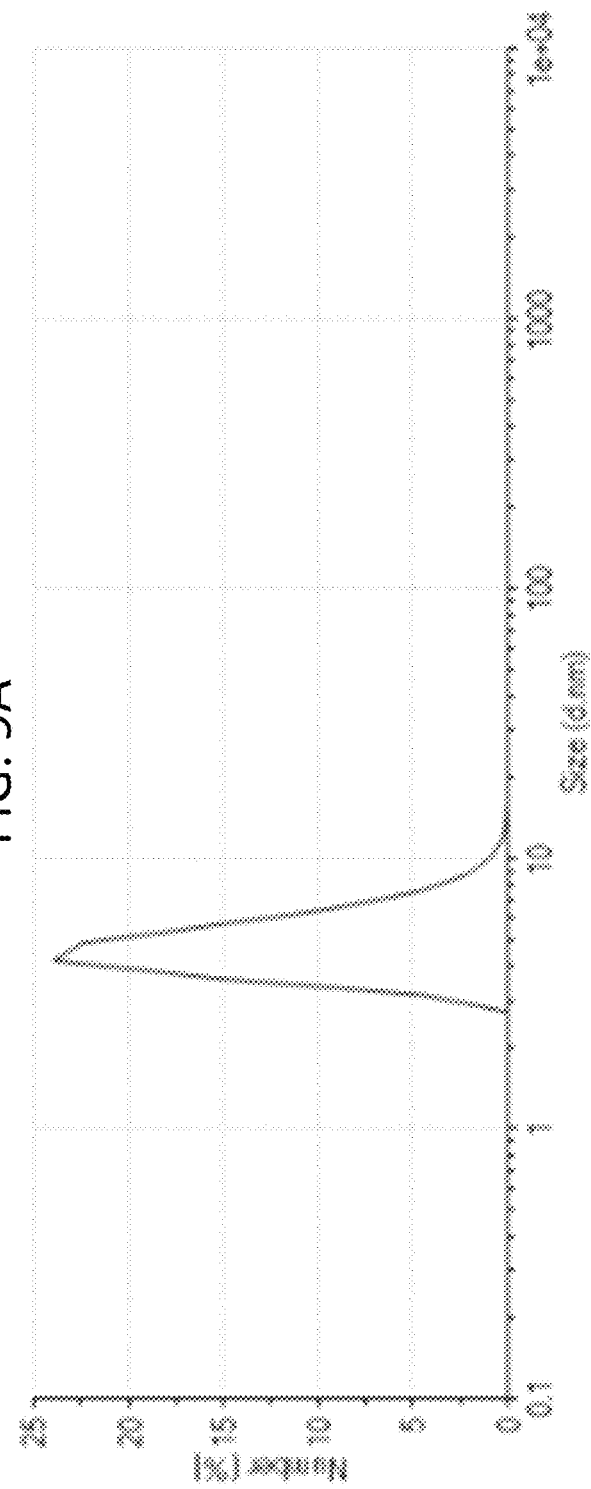
Figure 10:
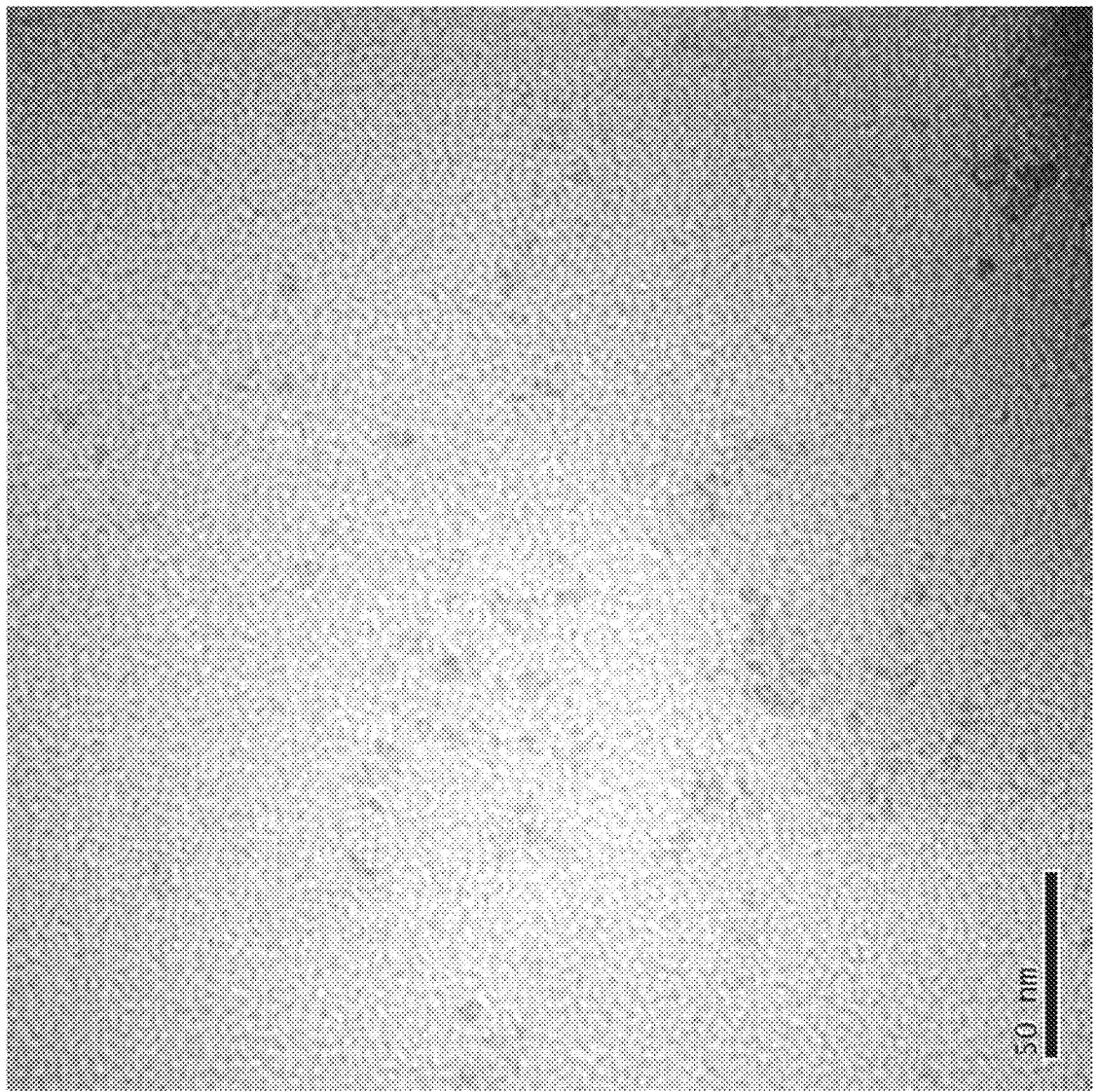
FIG. 10 is a TEM image of the as-synthesized g-C$_3$N$_4$ nanoparticles.

Yet alternatively, pure g-C3N4 nanodots may also be produced using a similar synthesis method but without adding the silica species, i.e. it is investigated in a DLS analysis that the thus-obtained g-$C_3N_4$ nanodots possessed an average diameter of ~ 5 nm as shown in FIGS. 9A and 9B.

A siloxane material such as 10 mL of N-(b-aminoethyl)-g-aminopropylmethyldimethoxysilane (AEAPMS) may be added to the $C_3N_4$ particles to form a mixture of carbon nitride particles and siloxane material, and the carbon nitride particles are functionalized by the siloxane when curing in another baking process at 120-300° C. The precursor or the mixture of the particles and the siloxane material may be placed in a Teflon-lined autoclave for the thermal treatment, in which the autoclave lid is tightly closed during the thermal treatment.

Alternatively, the process may be simplified in which the siloxane material may be added to the precursor followed by baking the mixture at 120-300° C. to obtained the functionalized carbon nitride particles.

For example, 0.4 g of citric acid monohydrate and 0.4 g thiourea may be added to 10 ml of N-(b-aminoethyl)-g-aminopropylmethyldimethoxysilane (AEATMS) under vigorous stirring. The mixture may then be transferred to a Teflon-lined autoclave (volume of 50 ml) to undergo the solvothermal reaction at 180° C. for 2 hours, followed by naturally cooling down to room temperature.

After cooling, the mixture may form a substance or silica gel which may be further solidified to form a thin film 104. For example, the substance may be adhesive to another material such as glass and polymer, and the substance may be coated on the surface of the encapsulation 110 of a UV-LED. After the substance or the material is fully solidify (such as aged for 3 hours or any predetermined period of time), the substance is a solid covering the UV-LED and the substance may be used to convert the UV light to white light during operation. The thin film 104 is transparent and flexible.

With reference to FIGS. 15A to 15D, the freshly-prepared gel may be coated onto the encapsulation of a UV (365 nm) LED using dip coating techniques. It was tested by the inventors that the bright white light emission under the UV excitation has a quantum yield of 27%.

Alternatively, referring to FIGS. 15E to 16D, the freshly prepared gel can also be used as water-washable ink of high fluorescence. With reference to FIGS. 15E to 15G, a calligraphy of letters "CityU" was written on a filter paper using the gel ink, the gel appears to be brown in daylight, while glowing intensive white light under a hand-held UV lamp (365 nm). The filter paper was dipped in water for 5 times immediately after the writing, and the letters remained a sharp fluorescent print afterwards. After the gel becomes completely solidified, the blurring of the fluorescence ink in water may be completely eliminated.

With reference to FIGS. 16A to 16D, the g-$C_3N_4$ nanodots were also applicable as fluorescent ink to enable calligraphy invisible under daylight and blue under UV light (365 nm).

However, the ink based on pure g-C3N4 nanodots is not as water-resistant as that based on g-C$_3$N$_4$-silica-gels.

With reference to FIGS. 11 to 12, a solid form of a thin film 104 of the substance or material is illustrated. Alternatively, additional gluing adhesive or polymer matrix may be used in fixing the carbon nitride particles to the electronic device 100. The substance or the thin film 104 produced is transparent and flexible such that it may be applied to different flexible surfaces such as clothing or a flexible substrate. Advantageously, the flexible thin film 104 may be used in a wide range of applications, such as flexible displays and wearable devices. For example, the g-C$_3$N$_4$-silica-gels based white LEDs can be used in wearable devices, due to their excellent biocompatibility and good color rendering index.

With reference to FIGS. 13 to 14, a white LED may be implemented with the aged g-C$_3$N$_4$-silica-gels knitted in a sweater which emitted bright white light. It may be advantageous that the wearable white LED devices 100 may be manufactured in large-scale production, in which the LEDs have the benefits of no toxicity, low cost, great fabrication convenience, environmental friendliness and high efficiency.

With reference to the table below, there is shown a comparison of the g-C$_3$N$_4$-silica-gels with other possible WLED materials.

| Materials | Biocompatibility | Fabrication convenience | Quantum Yield | CIE coordinates |
|---|---|---|---|---|
| g-C$_3$N$_4$-silica-gels | excellent | easy | 27% | (0.295, 0.293) |
| Silicon and carbon dots | good | complex | relatively low | (0.34, 0.32) |
| MOF | poor | medium | 5% | (0.27, 0.30) |
| Carbon dots and AgInS$_2$ | poor | medium | 15% | (0.3385, 0.3062) |
| Carbon nanorings | good | easy | — | (0.28, 0.27) |
| Copper indium sulfide | poor | complex | 62% | (0.33, 0.27) |
| (YAG:Ce) phosphor and silicone resin | poor | complex | 34.7% | (0.3360, 0.3355) |

These embodiments may be advantageous also in that the material may be applied in various applications due to its superior properties. The material is non-toxic, bio-compatible and bio-degradable such that it is suitable for applications such as wearable electronics and light sources in endoscopes, and it is environmental-friendly in both the production and the disposal the material.

According to the experiments carried out by the inventors, the thin film materials is non-metal and biocompatible graphite-carbon nitride (g-C3N4) silica gels (g-C3N4-silica-gels), which have the advantages of low cost, high quantum yield, high transparency, mechanical flexibility. Carbon nitride, may be viewed as graphite whose carbon lattice is partially substituted with N atoms in a regular fashion, is an appealing material for a variety of applications, such as but not limited to catalysts, bioimaging, drug delivery and sensing.

Advantageously, the material has a good color rendering index (70 as determined by the inventors) and the color may be fine-tuned within a range to suit different applications or requirements. In addition, the material has a high fluorescence output. Therefore, the material may replace the use of phosphor coating which includes metals and toxins.

The production of the material is also simple and cost-effective. The fabrication process is carried out in ambient pressure, which eliminates the risks and complexity associated with the application of high pressure in some other hydrothermal methods.

It will be appreciated by persons skilled in the art that numerous variations and/or modifications may be made to the invention as shown in the specific embodiments without departing from the spirit or scope of the invention as broadly described. The present embodiments are, therefore, to be considered in all respects as illustrative and not restrictive.

Any reference to prior art contained herein is not to be taken as an admission that the information is common general knowledge, unless otherwise indicated.

The invention claimed is:

1. A material for an electronic device, comprising: a substance arranged to emit light in a predetermined range of wavelength upon receiving an excitation energy, wherein the substance is bio-compatible and includes a plurality of carbon nitride particles and a siloxane material; wherein the plurality of carbon nitride particles and the siloxane material share an amide linkage such that the plurality of carbon nitride particles is connected to the siloxane material.

2. A material in accordance with claim 1, wherein the predetermined range of wavelength includes a range of wavelength visible to human eye.

3. A material in accordance with claim 2, wherein the light emitted by the substance is in white color visible to human eye.

4. A material in accordance with claim 1, wherein the excitation energy includes a photon excitation.

5. A material in accordance with claim 4, wherein the excitation energy includes ultra-violet light.

6. A material in accordance with claim 5, wherein the photon excitation has a range of excitation wavelength of 345 nm to 365 nm.

7. A material in accordance with claim 4, wherein the photon excitation is at least partially absorbed by the plurality of carbon nitride particles and/or the siloxane material.

8. A material in accordance with claim 1, wherein the plurality of carbon nitride particles includes C$_3$N$_4$ particles.

9. A material in accordance with claim 8, wherein each of the plurality of carbon nitride particles is of a size in a range of 1 nm to 1000 nm.

10. A material in accordance with claim 1, wherein the siloxane material includes N-(β-aminoethyl)-g-aminopropylmethyldimethoxysilane.

11. A material in accordance with claim 1, wherein each of the plurality of carbon nitride particles and a siloxane material is arranged to at least partially contribute the light emitted by the substance.

12. A material in accordance with claim 10, wherein the plurality of carbon nitride particles is arranged to contribute a first emission spectrum of blue color within the predetermined range of wavelength of the light emitted by the substance.

13. A material in accordance with claim 12, wherein the siloxane material is arranged to contribute a second emission spectrum within the predetermined range of wavelength of the light emitted by the substance such that the light emitted by the substance is in white color visible to human eye.

14. A material in accordance with claim 1, wherein at least one of the plurality of carbon nitride particles is functionalized by the siloxane material.

15. A material in accordance with claim 1, wherein the substance is a solid.

16. A material in accordance with claim 1, wherein the substance is flexible.

17. A material in accordance with claim 1, wherein the substance is adhesive.

18. A material in accordance with claim 1, wherein the electronic device is a light-emitting device or a sensor.

19. A light emitting device, comprising a light emitting element arranged to emit an excitation energy; and a material having a substance arranged to emit light in a predetermined range of wavelength upon receiving the excitation energy, wherein the substance is bio-compatible and includes a plurality of carbon nitride particles and a siloxane material; wherein the plurality of carbon nitride particles and the siloxane material share an amide linkage such that the plurality if carbon nitride particles is connected to the siloxane material.

20. A light emitting device in accordance with claim 19, wherein the light emitting element includes a light emitting diode.

21. A light emitting device in accordance with claim 19, wherein the substance is a thin film at least partially covering the light emitting element.

* * * * *